United States Patent
Gupta

(10) Patent No.: US 7,075,471 B1
(45) Date of Patent: Jul. 11, 2006

(54) DOUBLE-SAMPLED, TIME-INTERLEAVED ANALOG TO DIGITAL CONVERTER

(75) Inventor: Sandeep Kumar Gupta, Santa Clara, CA (US)

(73) Assignee: Teranetics, Inc., Santa Clara, CA (US)

(*) Notice: Subject to any disclaimer, the term of this patent is extended or adjusted under 35 U.S.C. 154(b) by 0 days.

(21) Appl. No.: 11/056,028

(22) Filed: Feb. 11, 2005

(51) Int. Cl.
*H03M 1/12* (2006.01)
(52) U.S. Cl. .................................... 341/155
(58) Field of Classification Search ............... 341/155, 341/159, 161
See application file for complete search history.

(56) References Cited

U.S. PATENT DOCUMENTS

| | | | |
|---|---|---|---|
| 4,349,887 A * | 9/1982 | Crowley .................... | 708/103 |
| 5,990,820 A * | 11/1999 | Tan ............................ | 341/161 |
| 6,160,578 A * | 12/2000 | Carroll et al. ........... | 348/222.1 |
| 6,292,121 B1 * | 9/2001 | Cake et al. ................. | 341/143 |
| 6,392,575 B1 * | 5/2002 | Eklund ....................... | 341/141 |
| 6,473,013 B1 * | 10/2002 | Velazquez et al. ......... | 341/120 |
| 6,535,156 B1 * | 3/2003 | Wang et al. ................ | 341/156 |
| 6,545,628 B1 * | 4/2003 | Aram ......................... | 341/155 |
| 6,570,410 B1 | 5/2003 | Manganaro ................ | 327/94 |
| 6,825,783 B1 * | 11/2004 | You ........................... | 341/118 |
| 2002/0105339 A1 * | 8/2002 | Nagaraj ..................... | 324/601 |
| 2005/0084037 A1 * | 4/2005 | Liang ........................ | 375/316 |

OTHER PUBLICATIONS

K. El-Sankary, A. Assi, and M. Sawan, A New Time-Interleaved Architecture for High-Speed A/D Converters, International Workshop on Digital and Computational Video, Nov. 2002.

Gabriele Manganaro, An Improved Phase Clock Generator for Interleaved and Double-Sampled Switched-Capacitor Circuits, 2001 IEEE.

* cited by examiner

*Primary Examiner*—Peguy JeanPierre
(74) *Attorney, Agent, or Firm*—Brian R. Short

(57) ABSTRACT

An apparatus and method for high-speed analog to digital conversion are disclosed. An ADC system includes a plurality of N/2 sub-ADCs, each sub-ADC receiving an analog signal and a clock signal and generating two digital samples at a rate of Fs/N. The two digital samples are generated with approximately 180 degree phase relationship relative to a frequency of Fs/N. The plurality of N/2 sub-ADCs of the time-interleaved ADC system, generate combined output samples at a rate of Fs. An ADC method includes a plurality of N/2 sub-ADCs receiving the analog signal, clocking each sub-ADC at a rate of FS/N. Each sub-ADC generates two digital samples at a rate of FS/(2N), the two digital samples being generated with approximately 180 degree phase relationship relative to a frequency of Fs/N. Outputs of the sub-ADCs are combined to generate digital samples at a rate of Fs.

25 Claims, 13 Drawing Sheets

DOUBLE-SAMPLED, TIME-INTERLEAVED ANALOG TO DIGITAL CONVERTER

FIELD OF THE INVENTION

The invention relates generally to electronics. More particularly, the invention relates to a double sampled, time interleaved analog to digital converter.

BACKGROUND OF THE INVENTION

High-speed networks are continually evolving. The evolution includes a continuing advancement in the operational speed of the networks. The network implementation of choice that has emerged is Ethernet networks physically connected over twisted pair wiring. One of the most prevalent high speed LANs (local area network) for providing connectivity between personal computers, workstations and servers is Ethernet in its 10BASE-T form.

High-speed LAN technologies include 100BASE-T (Fast Ethernet) and 1000BASE-T (Gigabit Ethernet). Fast Ethernet technology has provided a smooth evolution from the 10 megabits per second (Mbps) performance of 10BASE-T to the 100 Mbps performance of 100BASE-T. Gigabit Ethernet provides 1 Gigabit per second (Gbps) data rate with essentially the simplicity of Ethernet. There is a desire to push operating performance to even greater data rates.

Increases in the speeds of communication networks require increases in the speeds of ADCs used in the communication networks. A time-interleaved ADC architecture can effectively provide high-speed analog to digital conversion with ADCs that individually operate at much lower frequencies than the analog to digital conversion. Therefore, a time-interleaved ADC architecture can be used to increase the effective operational frequency of the ADCs.

FIG. 1 shows a time interleaved analog to digital converter architecture. A plurality of N sub-sample, sample and hold circuits 110, 112, 114 receive an analog signal. Clocks to each of the sample and hold circuits operate at a frequency of Fs/N, and include a phase of approximately (360/N)*(i−1), in which i varies from 1 to N. Each of the sample and hold circuits sample the incoming analog signal at calculated moments in time. The samples are input to corresponding M-bit ADCs 120, 122, 124. The ADCs 120, 122, 124 also include clocks that operate at a frequency of Fs/N, and include a phase of approximately (360/N)*(i−1). The delayed phase relationships of the clock signals result in digital samples from the ADCs which occur at a frequency of Fs. The result is an effective sampling frequency of Fs. N is the number of time interleaved ADCs and T is the period of the effective sampling frequency Fs.

The time interleaved architecture of FIG. 1 is fully sub-sampled (that is, sub-samples are generated by each of N sample and hold circuits, and processed by ADCs). Time interleaved architectures are useful for applications in which the desired sampling frequency Fs is higher than available individual ADCs or sample and hold circuits can operate. Each individual ADC and sample and hold circuit must only operate at a clock frequency of Fs/N.

The time interleaved ADC architecture of FIG. 1, however, has several limitations. For example, this time interleaved ADC architecture can suffer from gain errors, offset errors and phase timing errors, resulting in degradation of the signal to noise (SNR) of the combined sub-sample signals.

Generally, N interleaved ADCs require at least N operational amplifiers, in which each ADC includes at least one operational amplifier. Operational amplifiers dissipate a relatively large amount of power. Therefore, time interleaved ADC systems can dissipate more power than desired.

It is desirable to have a method and apparatus for high-speed analog to digital conversion of an analog signal. It is desirable that the method and apparatus dissipate lower amounts of power than existing ADC systems, and eliminate the disadvantages described above.

SUMMARY OF THE INVENTION

The invention includes an apparatus and method for high-speed analog to digital sample conversion.

A first embodiment includes a time-interleaved ADC system. The ADC system includes a plurality of N/2 sub-ADCs, each sub-ADC receiving an analog signal and a clock signal and generating two digital samples at a rate of Fs/N. The two digital samples are generated with approximately 180 degree phase relationship relative to a frequency of Fs/N. The plurality of N/2 sub-ADCs of the time-interleaved ADC system, generate combined output samples at a rate of Fs.

A second embodiment includes a method of converting an analog signal into digital samples. The method includes a plurality of N/2 sub-ADCs receiving the analog signal, clocking each sub-ADC at a rate of FS/N. Each sub-ADC generates two digital samples at a rate of FS/(N), the two digital samples being generated with approximately 180 degree phase relationship relative to a frequency of Fs/N. Outputs of the sub-ADCs are combined to generate digital samples at a rate of Fs.

Other aspects and advantages of the present invention will become apparent from the following detailed description, taken in conjunction with the accompanying drawings, illustrating by way of example the principles of the invention.

DETAILED DESCRIPTION

Figure 1:
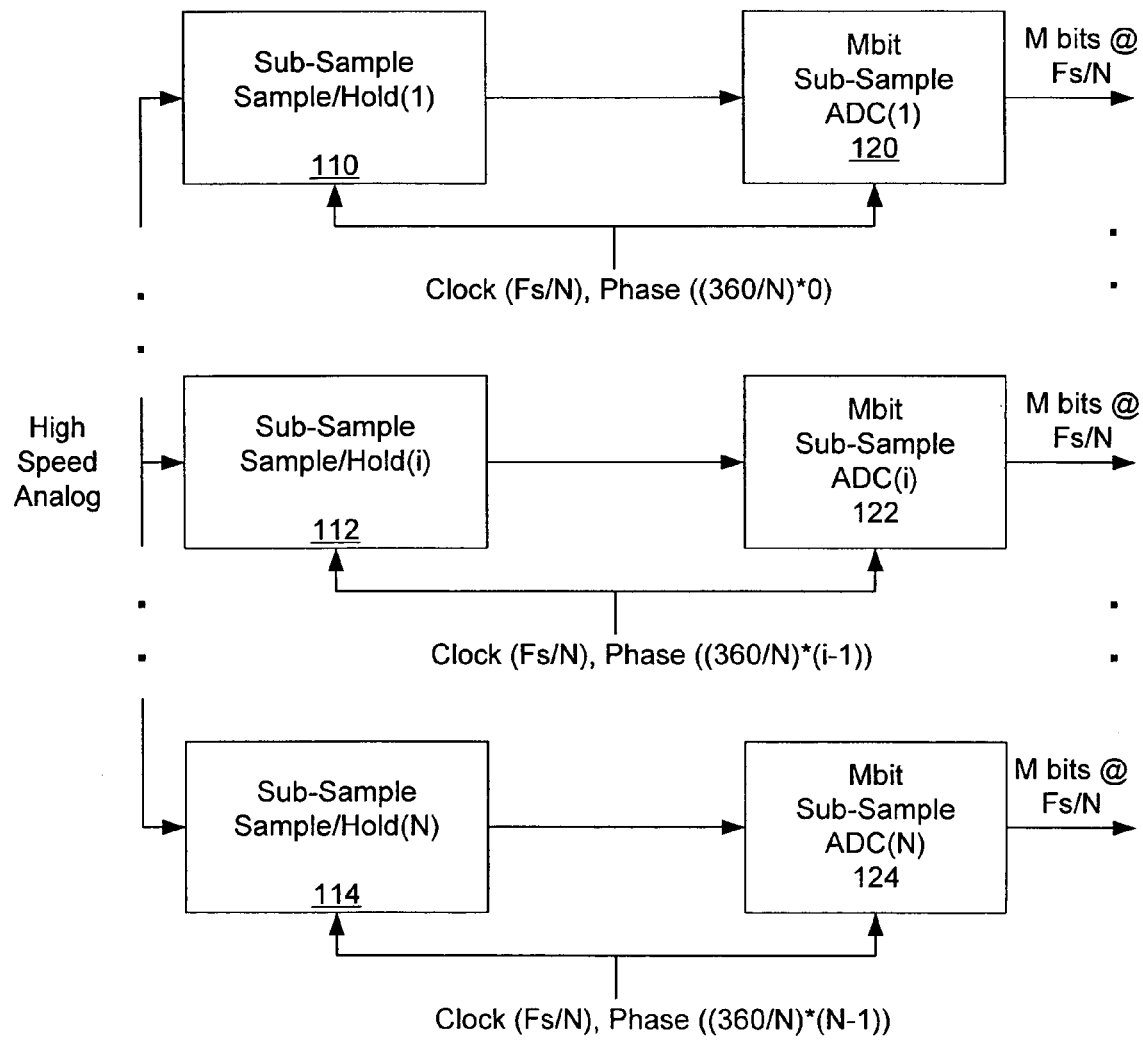
FIG. 1 shows a time interleaved analog to digital converter architecture.

As shown in the drawings for purposes of illustration, the invention is embodied in an apparatus and method for high-speed analog to digital sample conversion.

Figure 2:
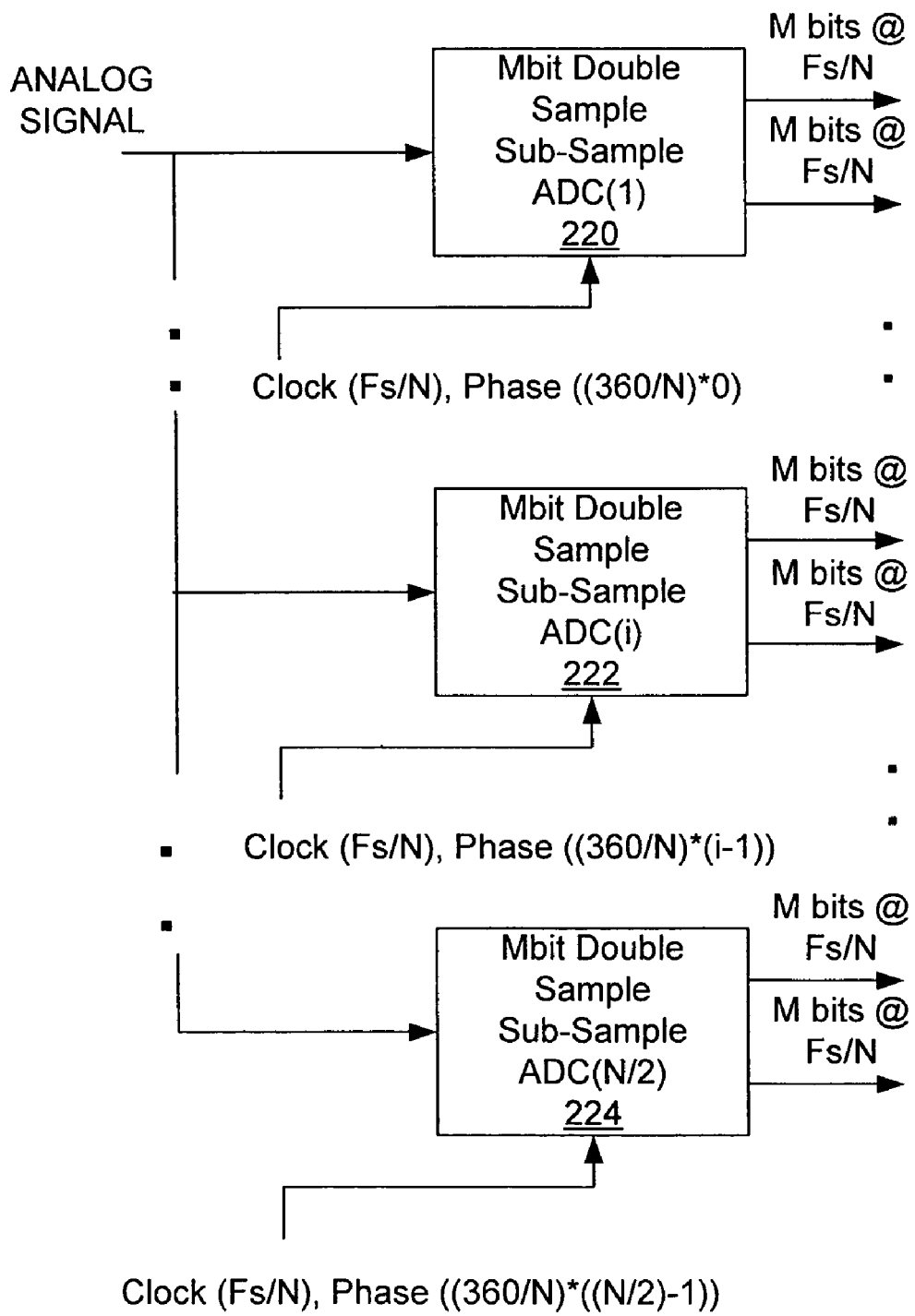
FIG. 2 shows a time interleaved, double sampled ADC system.

FIG. 2 shows time interleaved, double sampled ADC system. The time-interleaved ADC system includes N/2 sub-ADCs 220, 222, 224. Each sub-ADC 220, 222, 224 receives an analog signal (ANALOG SIGNAL) and a clock signal. Each sub-ADC 220, 222, 224 generates two digital samples at a rate of Fs/N, the two digital samples are generated with approximately 180 degree phase relationship relative to a frequency of Fs/N. The time-interleaved ADC system generates output samples at a rate of Fs, by combining the digital samples generated by the sub-ADC 220, 222, 224.

As shown in FIG. 2, each of the sub-ADCs 220, 222, 224 receive a clock signal. The clock signals shown in FIG. 2 are delayed in phase by (360/N)*(i−1) where i varies from 1 to N/2. As stated above, each sub-ADCs 220, 222, 224 generates two samples at a rate of Fs/N. The process for generating the two samples can be accomplished in a number of different ways. For example, a first of the two digital samples can be generated approximately at a rising edge of an Fs/N clock, and a second of the two digital samples can be generated approximately at a falling edge of the Fs/N clock. Another process for generating the two samples includes generating a first of the two digital samples approximately at a rising or a falling edge of a first Fs/(2*N) clock, and a generating a second of the two digital samples at approximately at a rising or falling edge of a second Fs/(2*N) clock, in which the second Fs/(2*N) clock is delayed from the first Fs/(2*N) clock by a period of time of approximately N/(Fs).

Figure 3:
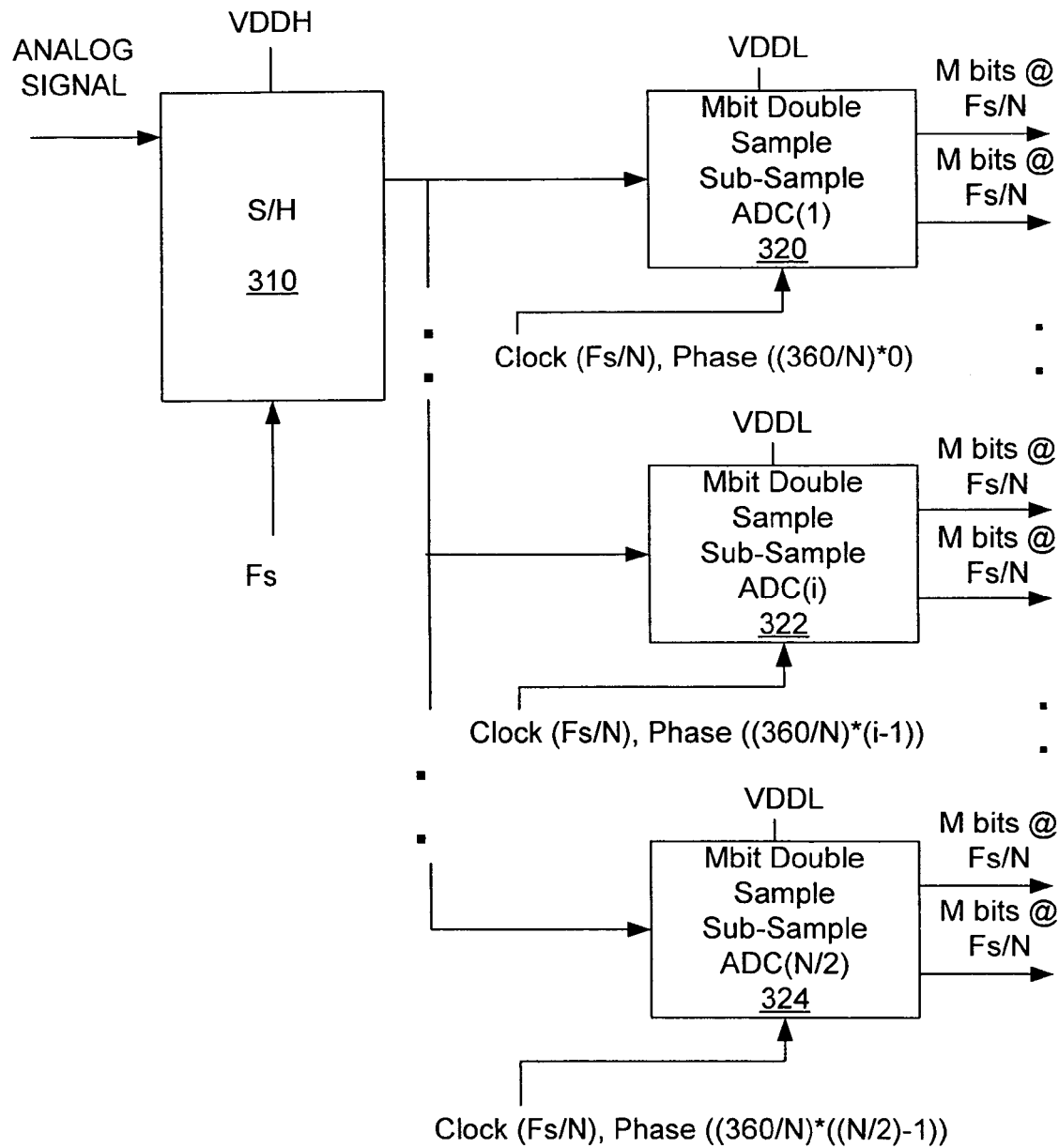
FIG. 3 shows a time interleaved, double sampled ADC system that includes a high-speed sample and hold input.

FIG. 3 shows a time interleaved, double sampled ADC system that includes a high-speed sample and hold input. This embodiment includes an input sample and hold (S/H) circuit 310 receiving the analog signal. The S/H circuit 310 generally comprises analog circuitry that samples and holds the analog signal at a rate of Fs. The sampling and holding provides inputs to the sub-ADCs that are more stable. The up-front sample and hold circuit can effectively eliminate the phase timing errors by holding the sampled analog signal at a rate of Fs. The sampled signal is static before being sub-sampled. Essentially, the sample and hold circuit 310 "slows down" the changes of the analog signal. As long as the sub-samples are made during the static (sampled) periods of the output of the sample and hold circuit 210, the phase timing errors can be eliminated.

An embodiment includes analog circuitry of the high-frequency (Fs) S/H circuitry 310 being powered by power supply VDDH that has a higher voltage potential than a voltage potential of a power supply VDDL powering lower frequency (for example, Fs/N) circuitry within the sub-ADCs 320, 322, 324. The higher voltage power supply VDDH is included with the S/H circuitry 310 to provide better linearity and distortion of signals being sampled and held by the S/H circuitry 310. To maintain linearity and low distortion of high frequency signals, bootstrapping or other linearizing circuits may be required to provide large signal swings. These circuits can require higher voltage potential power supplies.

Lower frequency circuits can be powered by lower voltage power supplies. High voltage power supplies typically result in high power dissipation. Therefore, high voltage power supplies are used with higher frequency signal operation when a desired level of accuracy is needed for the high frequency signals. Otherwise, low voltage power supplies are used to reduce power dissipation.

Figure 4:
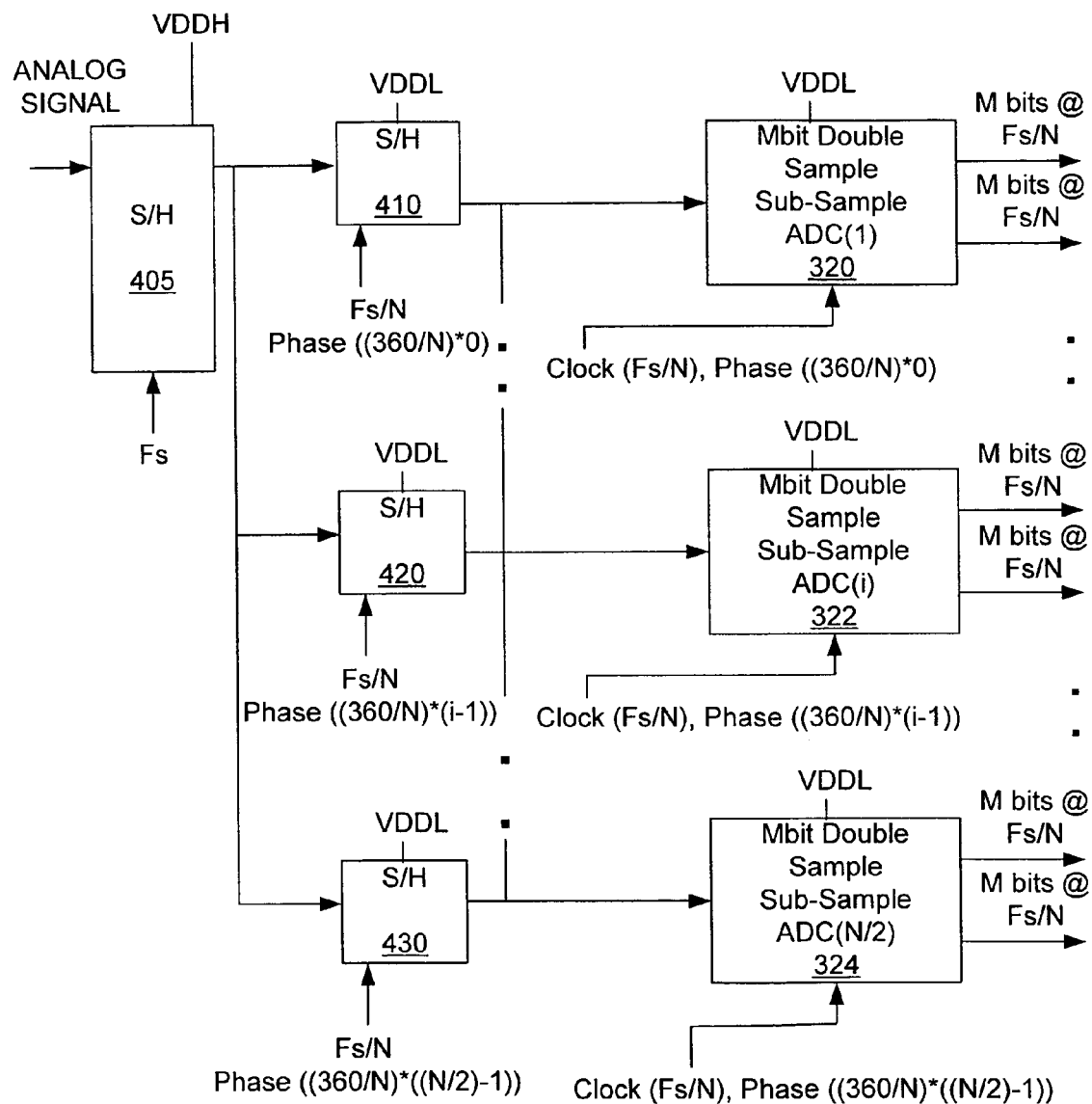
FIG. 4 shows a time interleaved, double sampled ADC system that includes multiple sub-sample and hold inputs.

FIG. 4 shows a time interleaved, double sampled ADC system that includes multiple sub-sample and hold inputs. The embodiment includes multiple sub-S/H circuits 410, 420, 430 providing additional sampling and holding of an output of the high frequency sampling and holding circuitry 405. The additional lower-frequency sampling and holding provides the set of sub-ADCs 320, 322, 324 with a sample and held signal having a rate of Fs/N as compared to the sample and held signal of FIG. 3 having a rate of Fs.

The higher frequency (Fs) sample and hold circuitry 405 can be powered by a power supply VDDH having a higher voltage potential than the voltage potential of a power supply VDDL powering the lower-frequency (Fs/N) sub-S/H circuits 320, 322, 324.

Figure 5:
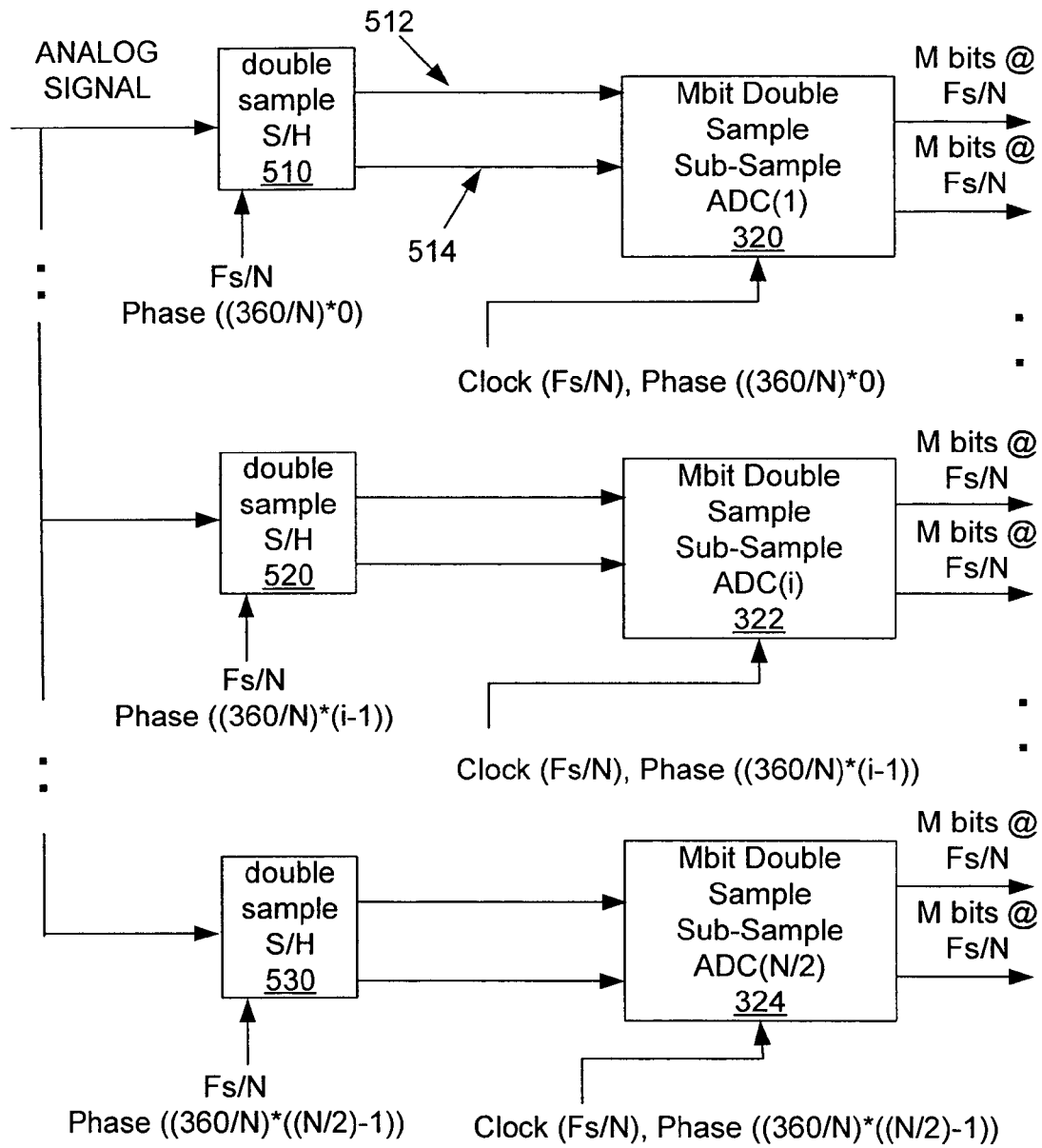
FIG. 5 shows another time interleaved, double sampled ADC system that includes multiple sub-sample and hold inputs.

FIG. 5 shows another time interleaved, double sampled ADC system that includes multiple sub-sample and hold inputs. Here, the single input high-frequency sample and hold circuit has been eliminated.

An embodiment includes N/2 time-interleaved, double sample, sub-S/H circuits, wherein each sub-S/H circuit generates two sample and held signals at a rate of Fs/N, each of the sample and held signals being received by a corresponding N/2 sub-ADCs. The two output samples are depicted in FIG. 5 by including two outputs from (such as outputs 512, 514) from each of the double sample, sample and hold circuits 510, 520, 530. Specific double sample circuits will be described later.

Switched Capacitor Circuits

As will be described, switched capacitor circuits can be adapted for use in circuits that employ the previously described methods of sampling and generating digital samples from an analog signal. A switched capacitor circuit can include a first capacitor that samples (the sampling charges the capacitor) an input signal at one phase of a clock signal (for example, the clock signal being at a high level), and transfers the charge to processing circuitry during a second phase of the clock signal. The processing circuitry can include switched capacitors in feedback of an operational amplifier of the switched capacitor circuit. An evaluation phase includes transferring the charge of the charging capacitor to the feedback circuitry.

An undesirable feature of a switch capacitor circuit sampler is that the operational amplifier (assuming the operational amplifier is a class A amplifier) only aids in the sampling of the analog signal during the evaluation phase. It would be desirable to more efficiently utilize the operational amplifier because the operational amplifier continually dissipates power during both the sampling phase, and the holding phase.

Double Sampling Circuits

The switched capacitor circuit just described may not optimal because the operational amplifier (again, assuming the operational amplifier is a class A amplifier) is not aiding in the processing while the switched capacitor circuit is charging. That is, the operational amplifier is consuming power, but not providing any useful benefit during the sampling period of the switched capacitor circuit. Double sampled, switched capacitor differential circuits that can be used in ADC system embodiments provide a more efficient use of the operational amplifiers. A feature of the double sampling circuits is that half the number of operational amplifier and ADCs (assuming each ADC includes double sampling circuits) are required for a time interleaved ADC system that uses the double sampling circuit. Double sampled, switched capacitor differential circuits can be adapted for use in circuits that employ the described embodiments for sampling and generating digital samples from an analog signal.

The double sampling circuits of FIGS. 6 and 8 (as will be described) include two sets of "ping-pong" capacitors (Cping, Cpong). When the "ping" capacitor is sampling (charging), the "pong" capacitor is in an evaluation phase. The evaluation phase typically includes transferring the charge of the corresponding capacitor to the operational amplifier. An opposite phase exits in which the roles of the capacitors are reversed. That is, the pong capacitor is sampling (charging) while the ping capacitor is in the evaluation phase. The ping-pong configuration is useful because it optimizes the operational use of the operational amplifier. That is, the operational amplifier which is one of the main power consuming elements of a switched capacitor ADC architecture is used during both cycles of the sampling. The two different phases of the ping-pong architecture are determined by a clock that should have an approximately 50 percent duty cycle.

The switched capacitor circuits of input ping-pong circuit are clocked so that they are out of phase. Additionally, the switched capacitor circuits located at the feedback of the operational amplifier are also clocked so that they are out of phase. Charging capacitors Cping are discharging while the charging capacitors Cpong are charging, and the charging capacitors Cpong are discharging while the charging capacitors Cping are charging.

Double sampling circuits can provide twice the conversion rate as compared to digital sample generating circuits that do not include double sampling. That is, twice the number of samples are generated for each clock cycle. Therefore, by using double sampling with time interleaved ADCs, only half the number of ADCs are required.

Figure 6:
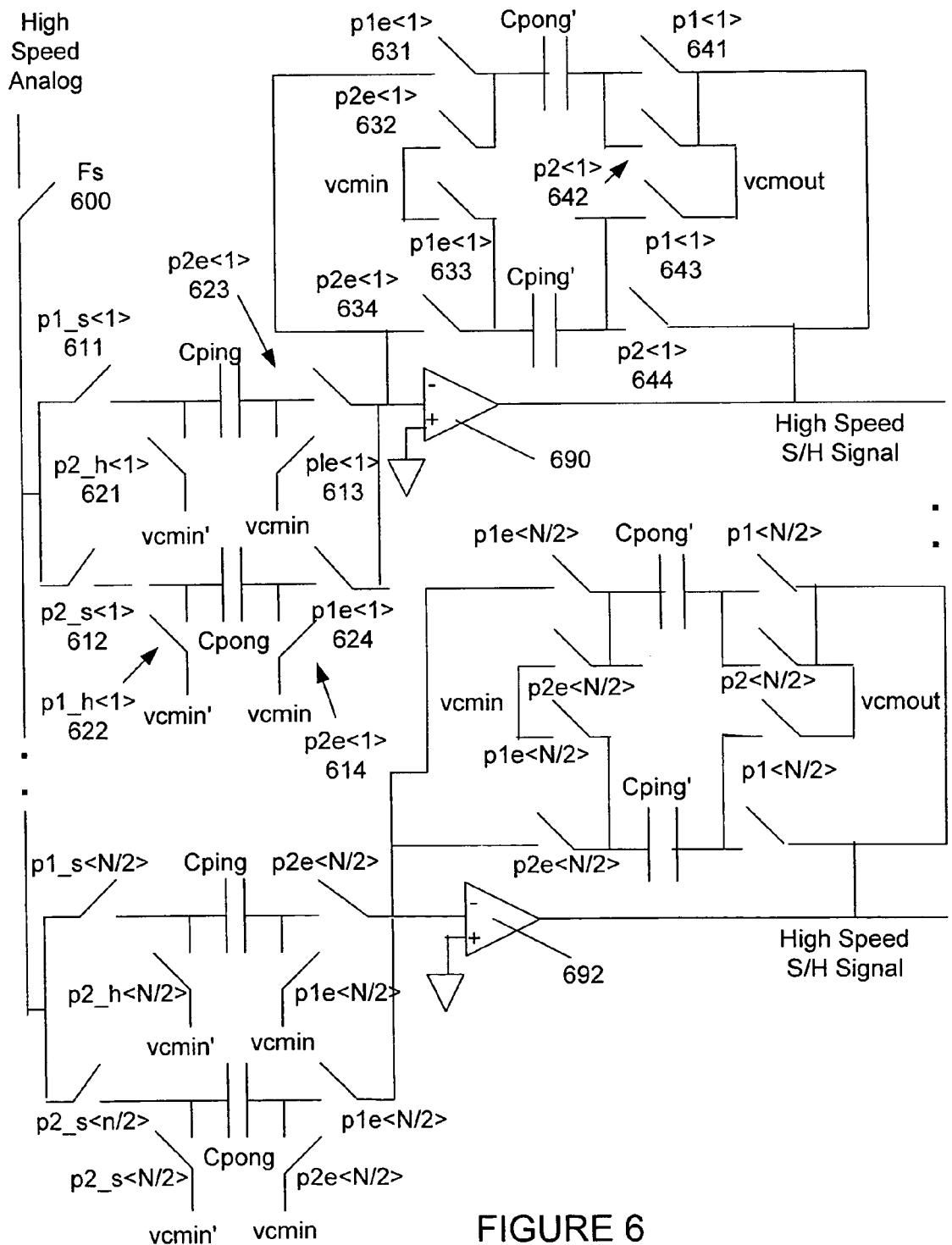
FIG. 6 shows a double sample S/H circuit that can be used for generating double samples for a double sampled ADC system.

FIG. 6 shows a double sample S/H circuit that can be used for generating double samples for a double sampled ADC system. More specifically, FIG. 6 shows double sampling, sub-sampling, sample and hold circuit architecture in series with a high-speed switch 600.

As shown, FIG. 6 shows N/2 sample and hold circuits that generate N sample and hold outputs. A single one of the N/2 chain will be described. It is to be understood that the other N/2−1 chains operate similarly.

A first chain includes the operational amplifier 690. An N/2 chain includes the operational amplifier 692. A switched capacitor circuit including the second sampler and the third sampler is configured in a double sampling mode through the use of "ping" and "pong" switched capacitor circuits. The two charging capacitors Cping and Cpong correspond to the previously described ping and pong switched capacitor circuits. The ping and pong charging capacitors Cping, Cpong are connected together at an input node of the operational amplifier 690 through switches 623 and 624, which acts as a virtual ground. One of the two charging capacitors Cping or Cpong is charging (sampling) while the other is discharging (evaluating). Therefore, the operational amplifier 690 is used efficiently in both the ping and pong charging phases. The charging (sampling) and discharging (evaluation) phases of the switched capacitor circuits are controlled by clock signals p1_s<i>, p1e<i>, p1_h<i>, p1<i>, p2_s<i>, p2e<i>, p2_h<i>, p2<i>. For i=1, the control clock signal p1_s<1> drives switch 611, p1e<1> drives switches 613, 624, 631, 633, p1_h<1> drives switch 622, p1<1> drives switches 641, 643, p2_s<1> drives switch 612, p2e<1> drives switch 623, 614, 632, 634, p2_h<1> drives switch 621, and p2<1> drives switches 642 and 644.

A feedback circuit is also included within the sample and hold circuit of FIG. 6. The feedback of the operational amplifier 690 includes switched capacitor circuits that include similar charging capacitors Cping' and Cpong'. The charging capacitors Cping' and Cpong' can be different than the previously described charging capacitors Cping and Cpong. The nodes ncmin, vcmin' and vcmout can be used with similar significance as described earlier.

By way of example, operation of a double sampling, sub-sampling, sample and hold circuit of FIG. 6 in which N=8, can be as follows. First samples are generated at a rate of Fs, by the first sampler as controlled by clock signal Fs. The samples are generated every 1/Fs. Second samples are generated by the second samplers at a rate of Fs/N. With N=8, 4 operational amplifiers are required, and an associated set of time interleaved ADCs only requires 4 ADCs.

Of the N=8 samples generated, a first chain (corresponding to first ADC) of the double sampled, sub-sampled Sample and Hold processes samples 1 and 5 from the first sampler. A second chain (corresponding to second ADC) of the double sampled, sub-sampled Sample and Hold processes samples 2 and 6 from the first sampler. A third chain (corresponding to third ADC) of the double sampled, sub-sampled Sample and Hold processes samples 3 and 7 from the first sampler. A fourth chain (corresponding to fourth ADC) of the double sampled, sub-sampled Sample and Hold processes samples 4 and 8 from the first sampler.

The embodiment of FIG. 6 provides reduced common mode signal transfer from the input to the output. The input can be referenced to a different power supply than the output. This embodiment is less sensitive to the parasitic capacitances of the charging capacitors. The output of the sample and hold circuit includes only sub-sampled signals, thereby reducing nonlinearities associated with high speed track signals. The operational amplifier 690 of FIG. 6 is subject to much lower input signal swings than the buffers of other embodiments, thereby easing design requirements for accuracy and linearity. Additionally, the embodiment of FIG. 6 includes double sampling, and therefore, benefits from the improved power consumption.

Figure 7A:
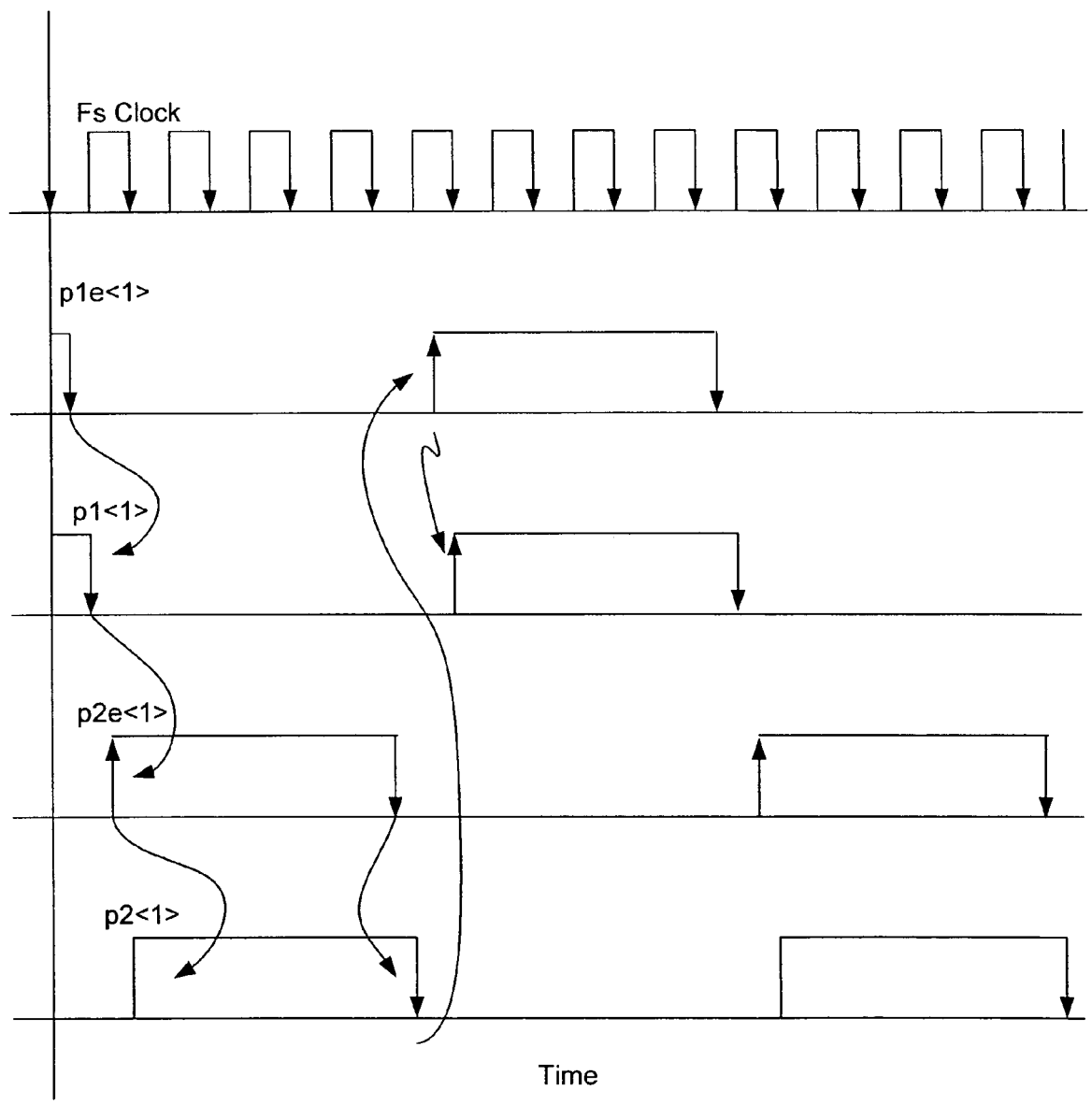
FIGS. 7A and 7B show clock control signals for controlling the double sample S/H circuit of FIG. 6.
Figure 7B:
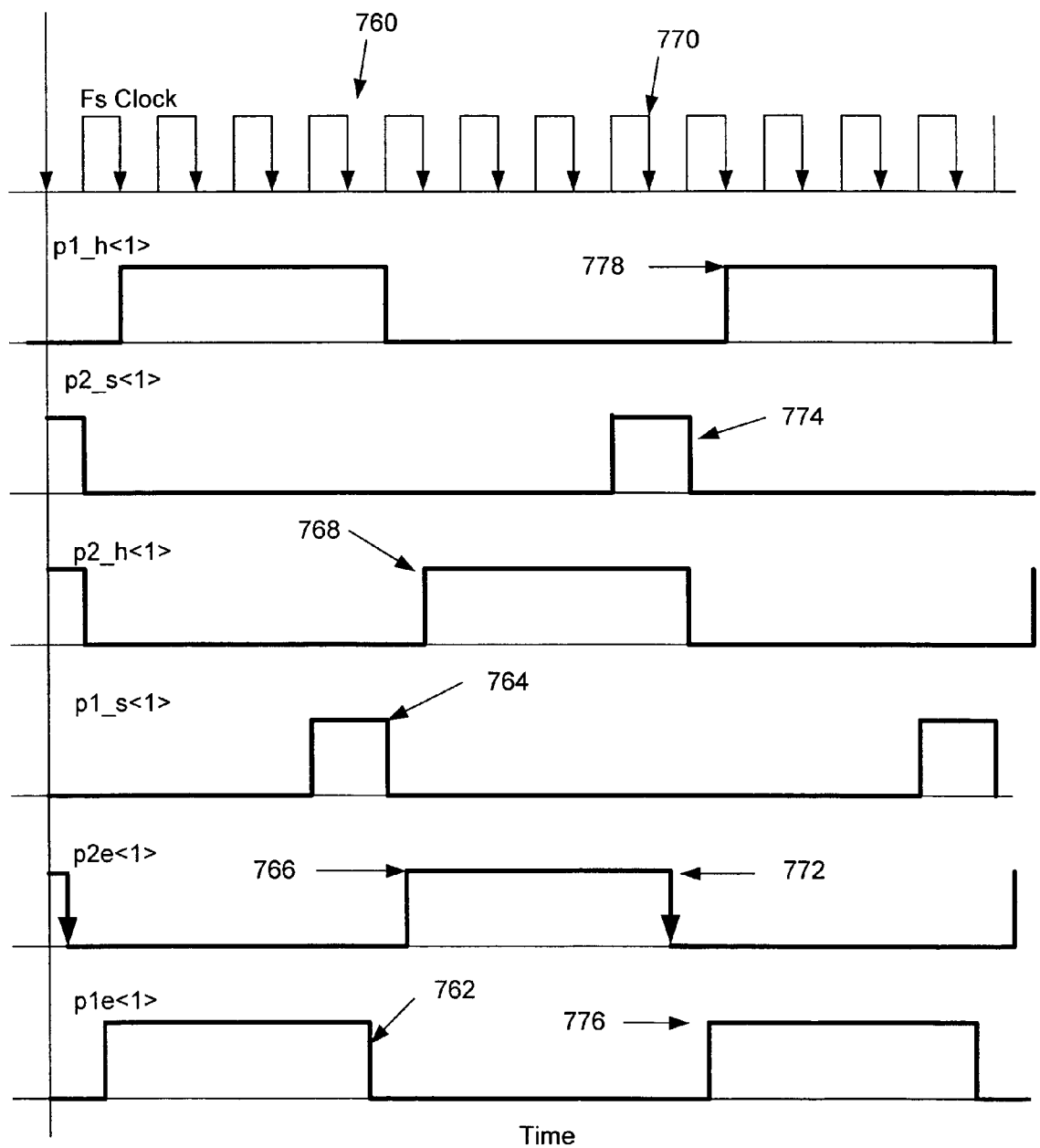

FIGS. 7A and 7B showing timing diagrams of exemplary clock signals of the circuit of FIG. 6.

As shown in FIG. 7B, after a falling edge 760 of the clock Fs (chosen arbitrarily at time t), a falling edge 762 of the sub-sampled clock p1e<1> occurs. The clock p1e<1> has approximately 50% duty cycle, and is connected to (drives) the switch 613, as well as other switches as shown in FIG. 6. Another clock p1_s<1> (FIG. 7B) is generated such that this clock has a low duty cycle approximately equal to 1/N. This duty cycle is selected so that no two capacitors (or at least never more than two capacitors) in second sub-sampling samplers load the first sampler 1000 at the same time. The switch 611 driven by p1_s<1> is connected in series with the first sampler switch 600 which is controlled by the clock signal Fs. The falling edge 764 of p1_s<1> is forced to occur after falling edge 762 of p1e<1> in the clock generator circuit. Therefore it does not contribute to signal dependent charge injection, as the switch 613 sampled with p1e<1> does not have signal dependent charge, and its turn-off cannot contribute to signal dependent charge injection.

The first sample is taken with respect to a falling edge 760 of the high speed clock Fs of the first sampler 600. The first sample (of the eight) is sampled by the "ping" portion of the second sub-sampled sampler, at the falling edge 762 of clock p1e<1>. The corresponding clock p1_s<1> has a 1/N duty cycle, ensuring that when sampling is being performed by the ping portion of the sub-sampled second sampler, no other sampler in the set of sub-sampled second samplers loads the first sampler 600. The evaluation phase is controlled by the clock signals p2e<1> and p2_h<1>, which are complementary to p1e<1>, p1_h<1>. The evaluation is performed by the third sampler. During the evaluation phase, the first sample is transferred to the output of the sample and hold circuit of FIG. 6. This is achieved by turning on switch 623 with clock signal p2e<1> and then turning on switch 621 with clock signal p2_h<1>. These two operations are achieved by the rising edge 766 of p2e<1> and rising edge 768 of p2_h<1>.

The fifth sample is taken with respect to a falling edge 770 of the high speed clock Fs of the first sampler 600. The fifth sample (of eight) is sampled by the "pong" portion of a second sub-sampled sampler, at the falling edge 772 of clock p2e<1>. The corresponding clock p2_s<1> has a 1/N duty cycle, ensuring that when sampling is being performed by the pong portion of the sub-sampled second sampler, no other sampler in the set of sub-sampled second samplers loads the first sampler 600. The switch 612 driven by p2_s<1> is connected in series with the first sampler switch 600 which is controlled by the clock signal Fs. The falling edge 774 of p2_s<1> is forced to occur after falling edge 772 of p2e<1> in the clock generator circuit. The evaluation phase is controlled by the clock signals p1e<1> and p1_h<1>, which are complementary to p2e<1>, p2_h<1>. The evaluation is performed again by the third sampler. During the evaluation phase, the fifth sample is transferred to the output of the sample and hold circuit of FIG. 6. This is achieved by turning on switch 624 with clock signal p1e<1> and then turning on switch 622 with clock signal p1_h<1>. These two operations are achieved by the rising edge 776 of p1e<1> and rising edge 778 of p1_h<1>.

Paralleling the description of the N=1 sample and hold circuit, the N=2, 3, 4 sample and hold circuits perform similar sampling and holding to generate the (2, 6), (3,7), (4,8) samples. That is, the N=2 sample and hold circuit generates the 2 and 6 samples of the eight, the N=3 sample and hold circuit generates the 3 and 7 samples of the eight, and the N=4 sample and hold circuit generates the 4 and 8 samples of the eight.

The clock circuits must be designed that generate the clock signals p1e<1:4>, p2e<1:4>, p1_h<1:4>, p2_h<1:4>, p1_s<1:4>, p2_s<1:4>, p1<1:4>, p2<1:4> shown in FIGS. 7A and 7B.

FIG. 7A shows the clock signals p1<1> and p2<1> in addition to FIG. 7B. >. It is to be understood that these clock signals are exemplary. These clock signals p1<1> and p2<1> are used to drive the switches for one embodiment of the feedback circuit of the operational amplifier 690 as shown in FIG. 6. As shown in FIG. 7A, the clock signals p1e<1> and p2e<1> are non-overlapping and clock signals p1<1> and p2<1> are non-overlapping. The clock signals p1<1> is delayed by a small amount with respect to p1e<1>. The clock signal p2<1> is delayed by a small amount with respect to p2e<1>.

The common mode voltages in (vcmin, vcmin') of FIG. 6 (and FIG. 8) can be biased at different voltages. This allows the switched capacitor circuit to provide isolation between two different power supplies. The existence of the two power supplies allows the switches on either side of the charging capacitors Cping, Cpong to be controllable by clocks having different on/off voltage levels. Additionally, the existence of more than one power supply allows the analog signal to be referenced to a different power supply (higher or lower) that the output signal of the sample and hold circuit each sample.

Figure 8:
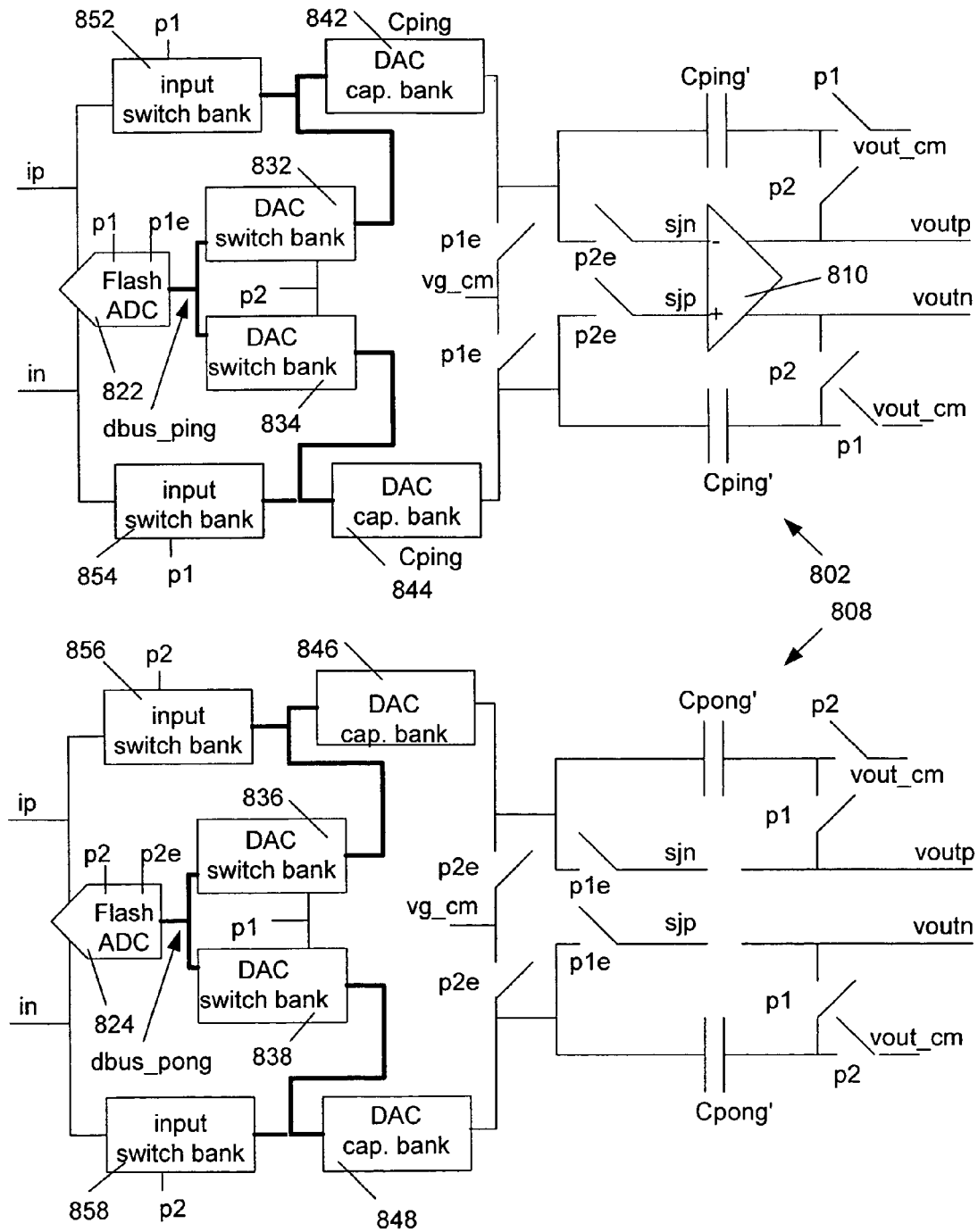
FIG. 8 shows an exemplary circuitry that can be included within a double sampled ADC.
Figure 9:
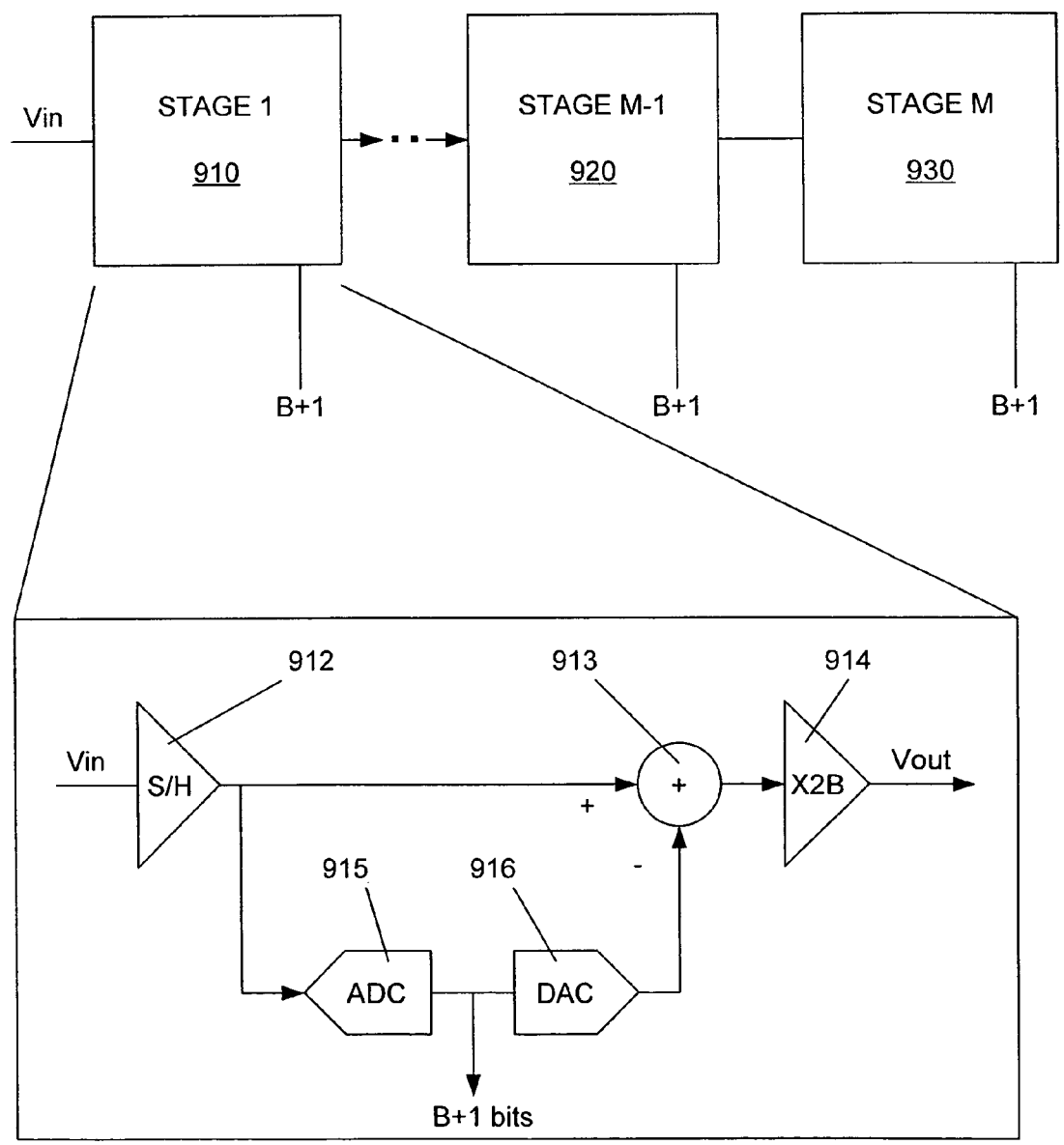
FIG. 9 shows a pipeline ADC system.

FIG. 8 shows exemplary circuitry within a double sampled ADC. FIG. 9 shows multiple ADC stages. FIG. 8 shows greater detail of a single one of the multiple stages shown in FIG. 9. The switched capacitor, double sampled, ADC circuit of FIG. 8 includes a single operational amplifier 810 having inputs of sjn (summing junction negative) and sjp (summing junction positive). The two samples are generated by receiving differential inputs ip, in (the analog signal input), and generating differential outputs voutp, voutn.

A first sample of the double sample is generated by ADC ping circuitry 802, and a second sample of the double sample is generated by ADC pong circuitry 808. The timing of the first and second sample is controlled by clock signals p1, p2, p1e, p2e. The clock signals of FIG. 8 can be controlled by the clock signals as shown in FIGS. 7A and 7B (FIG. 7A shows p1e<1>, p1<1>, p2e<1>, p2<1> which correspond with p1e, p1, p2e, p2 of FIG. 8).

The ADC circuitry 802 includes a flash ADC 822 (this ADC corresponds with the ADC 915 of FIG. 9). The flash ADC 822 receives the p1, p1e clock signals, and generates a multi-bit output referred to as dbus_ping. The dbus_ping output is received by DAC switch banks 832, 834 that control a DAC capacitor banks 842, 844. The DAC capacitor banks 842, 844 subtract a representation of the input analog signal from the analog signal. The residue after the subtraction is amplified by the operational amplifier 810 to span half the input range of the next stage or half the full scale range of the ADC. The other half of the full scale range of the ADC is reserved for error correction. That is, correcting errors due to, for example, offsets of the operational amplifier 810.

FIG. 8 shows a first stage of a pipeline converter operating in a ping-pong, double-sampling scheme. The input switch banks 852, 854, 856, 858 are a series of switches operated by the clock signal p1 in the "ping" section of the first stage, and by the p2 clock signal in the "pong" section of the first stage. The DAC switch banks 832, 834, 836, 838 are also a series of switches in which inputs of the series of switches are driven by the "dbus_ping" or "dbus_pong" outputs of the flash ADCs 822, 824, and the other end of the series of switches are connected to the input switched banks 852, 854, 856, 858.

The DAC capacitor banks 842, 844 are driven by the input switch banks 852, 854 or the DAC switch banks 832, 834 in the phases of the clock signals as determined by p1 and p2 respectively for the "ping" section of the first stage. The other terminal of the DAC capacitor banks 842, 844 is connected through a switch driven by p1e to a node "vg_cm". The node vg_cm can be maintained at an appropriate voltage potential to aid in the operation of the operational amplifier 810 because vg_vm set the voltage of the input common node of the operational amplifier 810. DAC capacitor banks 846, 848 operate equivalently for the "pong" section.

The flash ADCs 822, 824 generate a "B" bit digital representation of the input signal. For the ping phase this is dbus_ping, and for the pong phase, this is dbus_pong. In the circuit of FIG. 8, the goal is to subtract an analog representation of the B bit output from the original analog input, generate a residue and amplify the residue by a feedback mechanism. The node vout_cm is a voltage potential that is the desired output common mode voltage of the operational amplifier 810.

FIG. 9 shows a pipeline ADC system. The pipeline includes M stages 910, 920, 930. FIG. 9 shows a first stage 910 in greater detail. The other stages 920, 930 are similarly configured. As shown, each stage outputs B+1 bits.

The first stage 910 includes an input sample and hold circuit 912. The output of the sample and hold circuit 912 is received by and ADC 915 and a summer 913. The ADC 915 generates the output B+1, which is also input to a DAC 916. The DAC 916 generates a digital input to the summer 913 which is subtracted from the sample and hold circuit 912 output. An interstage amplifier 914 generates an output for a following stage.

Each stage samples the signal from the previous stage and quantizes it to B+1 bits. The quantized signal is subtracted and the residue is amplified through the interstage amplifier 914 to be sampled by the by the subsequent stage. The same procedure is repeated in each stage down the pipeline to perform A/D conversion. The number of comparators required is the number of stages times the number of comparators in each stage. The number of stages is approximately the ADC resolution divided by effective per-stage resolution. Effective per-stage resolution her is denoted with B, and one extra bit is used for digital correction.

Figure 10:
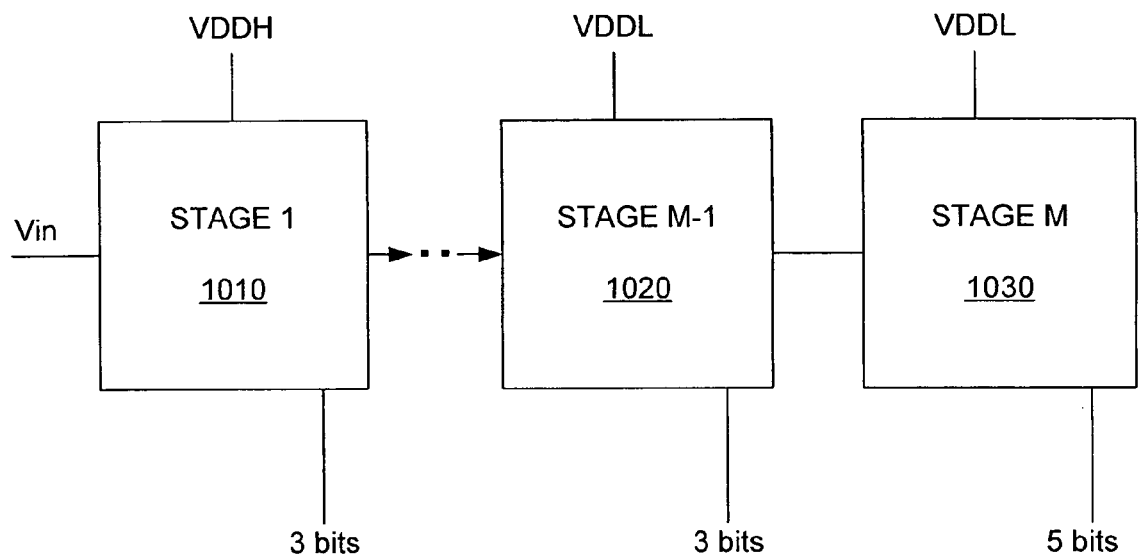
FIG. 10 shows another pipeline ADC system.

FIG. 10 shows another pipeline ADC system. Again, this pipeline ADC includes M stages. The number of stages can be M=3. The number of bits output by each converter stage can vary. For example, FIG. 10 shows the first stage 1010 outputting 3 bits, the M-1 stage outputting 3 bits, and the M stage 1030 outputting 5 bits. Additional bits of the converters can be used for error correction.

The stages within the pipeline converter can be powered with power supplies having varying voltage potentials. For example, the first stage 1010 can be powered with a power supply VDDH having a higher voltage potential that is greater than the voltage potential of another power supply VDDL that powers subsequent stages 1020, 1030. Generally, the stages requiring greater accuracy (that is, greater linearity or better noise performance) can be powered by higher voltage potential power supplies than stages that need lower accuracy. The accuracy needed for each of the stages in a pipeline ADC system tends to decrease with every stage. That is, the earlier stages generally have greater accuracy demands, and therefore, are powered with higher voltage potential power supplies. The later stages generally do not have the same accuracy demands (demands are lower), and are therefore, powered with lower voltage potential power supplies. Accuracy can provide a measure of the signal to noise ratio of a signal plus distortion.

Figure 11:
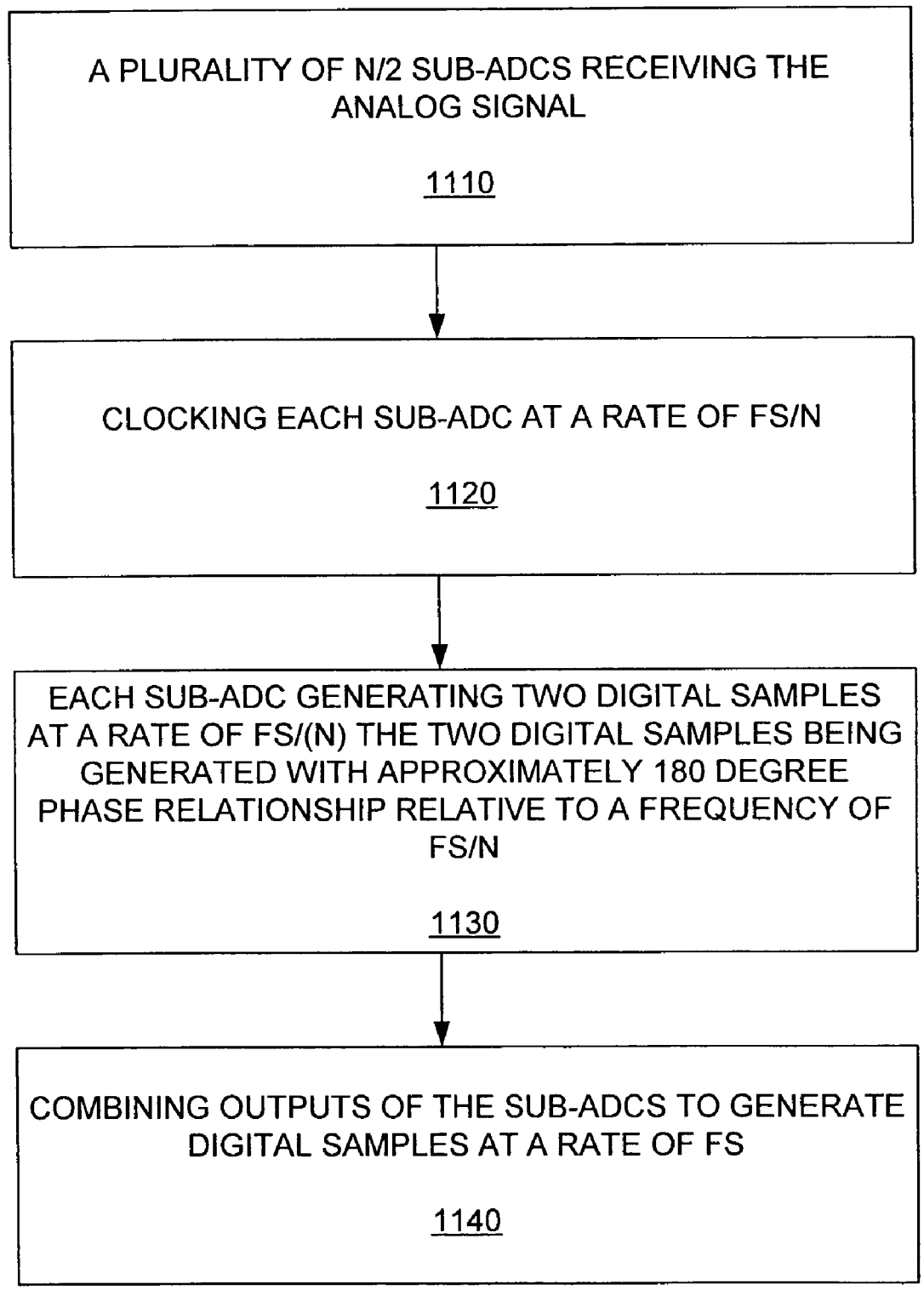
FIG. 11 is a flow chart that shows steps included within a method of high-speed analog digital converting.

FIG. 11 is a flow chart that shows steps included within a method of high-speed analog digital converting. A first step 1110 includes a plurality of N/2 sub-ADCs receiving the analog signal. A second step 1120 includes clocking each sub-ADC at a rate of FS/N. A third step 1130 includes each sub-ADC generating two digital samples at a rate of FS/(2N) the two digital samples being generated with approximately 180 degree phase relationship relative to a frequency of Fs/N. A fourth step 1140 includes combining outputs of the sub-ADCs to generates digital samples at a rate of Fs.

Figure 12:
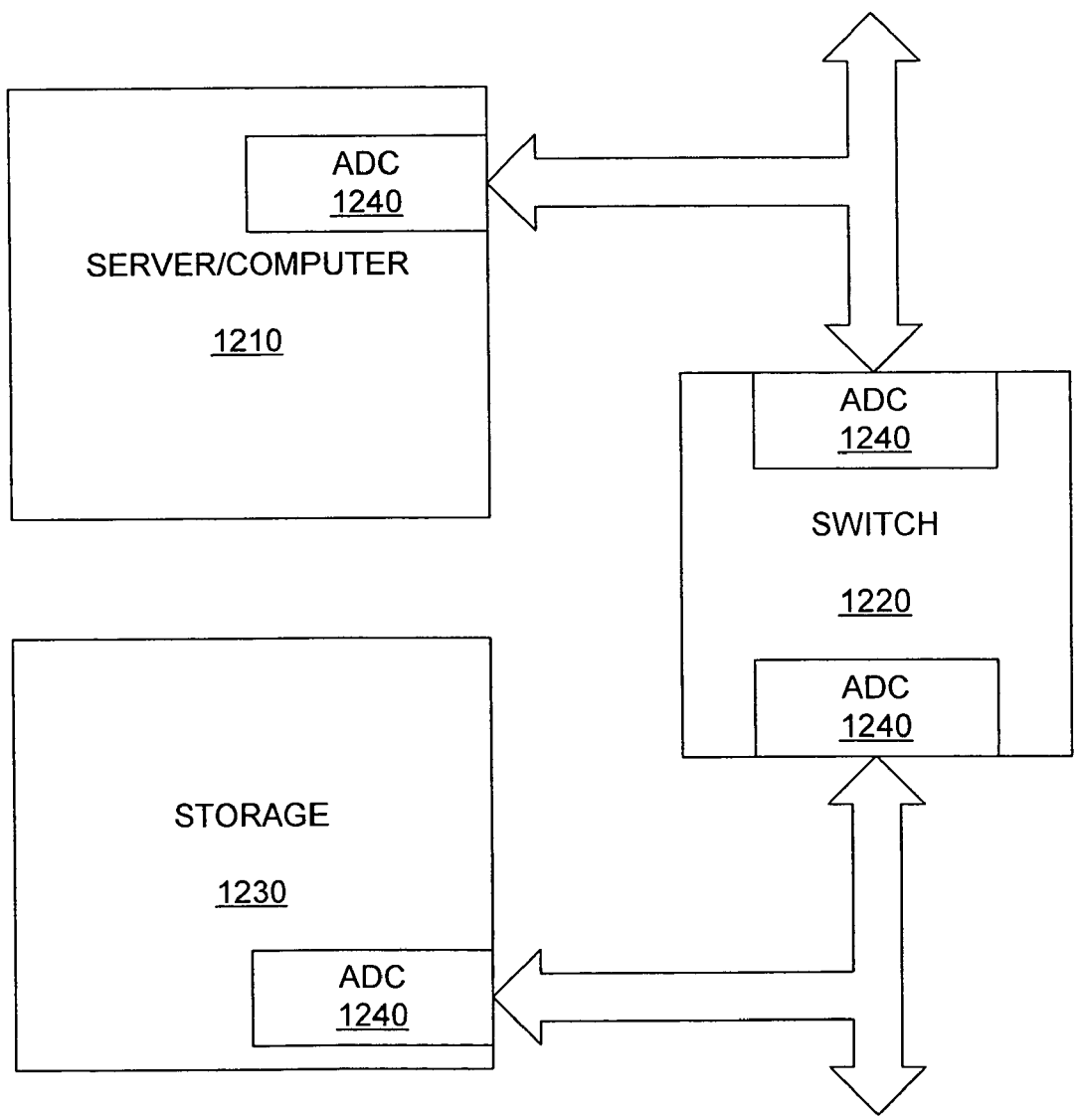
FIG. 12 shows devices connected to an Ethernet network that can include embodiments of the analog to digital converting.

FIG. 12 shows devices connected to an Ethernet network that can include embodiments of the analog to digital converting. Ethernet transceivers can utilize the high-speed interleaved ADCs 1240 as described for reception of analog signals, and conversely, as DACs generating analog signals. The Ethernet transceivers can be included within a server 1210, a switch 1220 or a storage device 1230. Clearly, other types of devices could use the Ethernet transceivers as well.

Although specific embodiments of the invention have been described and illustrated, the invention is not to be limited to the specific forms or arrangements of parts so described and illustrated. The invention is limited only by the appended claims.

I claim:

1. A time-interleaved ADC system comprising:
   a plurality of N/2 sub-ADCs, each sub-ADC receiving an analog signal and a clock signal and generating two digital samples at a rate of Fs/N, wherein generating two digital samples at a rate of Fs/N comprises generating a first of the two digital samples approximately at a rising edge of an Fs/N clock and generating a second of the two digital samples approximately at a falling edge of the Fs/N clock; and wherein
   the plurality of N/2 sub-ADCs of the time-interleaved ADC system generate combined output samples at a rate of Fs.

2. The system of claim 1, further comprising:
   an input sample and hold (S/H) circuit receiving the analog signal, and comprising analog circuitry that samples and holds the analog signal at a rate of Fs.

3. The system of claim 2, wherein the input sample and hold circuit further comprises N/2 time-interleaved sub-S/H circuits, wherein each of N/2 sub-S/H circuits generate two sample and hold signals at a rate of Fs/N, each of the sample and hold signals being received by a corresponding one of the N/2 sub-ADCs.

4. The system of claim 2, wherein the time-interleaved circuits comprise circuits operating at a clock frequency of Fs, and circuits operating at clock frequencies less than Fs, and wherein the circuits operating at a clock frequency of Fs operating at rate of Fs are powered by a power supply which has a higher voltage than the voltage of a power supply powering the circuits operating at clock frequencies less than Fs.

5. The system of claim 1, further comprising an input sample and hold (S/H) circuit receiving the analog signal, the input sample and hold circuit comprising N/2 time-interleaved sub-S/H circuits, wherein each sub-S/H circuit generates two sample and held signals at a rate of Fs/N, the two digital samples being generated with approximately 180 degree phase relationship relative to a frequency of Fs/N, each of the sample and held signals being received by a corresponding N/2 sub-ADCs.

6. The system of claim 1, further comprising processing of the N digital samples to correct gain and offset errors between the N/2 sub-ADCs.

7. The system of claim 1, each sub-ADC comprising a pipelined converter.

8. The system of claim 7, wherein each pipelined converter comprises a plurality of converter stages, a number of bits output by at least one of the converter stages being different than other of the converter stages.

9. The system of claim 8 wherein circuits of a first stage of the pipelined converter are powered by a power supply which has a higher voltage than voltage of a power supply powering other of the converter stages of the pipelined converter.

10. The system of claim 7, wherein each pipelined converter comprises a plurality of converter stages, and at least one of the stages comprises at least one additional bit that is used for error correction.

11. A method of converting an analog signal into digital samples, comprising:
   a plurality of N/2 sub-ADCs receiving the analog signal;
   clocking each sub-ADC at a rate of FS/N;

each sub-ADC generating two digital samples at a rate of FS/(N), wherein generating two digital samples at a rate of Fs/(N) comprises generating a first of the two digital samples approximately at a rising edge of an Fs/N clock and generating a second of the two digital samples approximately at a falling edge of the Fs/N clock; and wherein combining outputs of the sub-ADCs to generate digital samples at a rate of Fs.

12. The method of claim 11, further comprising:
sampling and holding the analog signal at a rate of Fs.

13. The method of claim 12, wherein sampling and holding the analog signal comprises N/2 time-interleaved sub-S/H circuits each sampling and holding the analog signal at a rate of Fs/N.

14. The method of claim 13, wherein each sub-S/H circuit generates two samples at a rate of Fs/(N).

15. The method of claim 14, further comprising:
powering circuitry operating at a clock frequency Fs with a higher voltage potential;
powering circuitry operating at clock frequencies less than Fs at a lower voltage potential.

16. The method of claim 11, further comprising sampling and holding the analog signal, the sampling and holding comprising N/2 time-interleaved sub-S/H circuits each sampling and holding the analog signal at a rate of Fs/N.

17. The method of claim 16, each sub-S/H circuit generating two samples at a rate of Fs/(N).

18. The method of claim 11, each sub-ADC generating two output digital samples per Fs/(N) clock period.

19. The method of claim 18, further comprising combining the two output digital samples forming a single data stream.

20. The method of claim 11, each sub-ADC comprising a pipe line converter.

21. The method of claim 20, wherein each pipe line converter comprises a plurality of converter stages, the number of bits output by at least one of the converter stages being different than other of the converter stages.

22. The method of claim 20, wherein each pipe line converter comprises a plurality of converter stages, and at least one of the stages comprises at least one additional bit that is used for error correction.

23. A time-interleaved ADC system comprising:
a plurality of N/2 sub-ADCs, each sub-ADC receiving an analog signal and a clock signal and generating two digital samples at a rate of Fs/N, wherein generating two digital samples at a rate of Fs/N comprises generating a first of the two digital samples approximately at a rising or a falling edge of a first Fs/(2*N) clock and generating a second of the two digital samples approximately at a rising or falling edge of a second Fs/(2*N) clock, the second Fs/(2*N) clock delayed from the first Fs/(2*N) clock by a period of time of approximately N/(Fs);

the plurality of N/2 sub-ADCs of the time-interleaved ADC system generate combined output samples at a rate of Fs.

24. A method of converting an analog signal into digital samples, comprising:
a plurality of N/2 sub-ADCs receiving the analog signal;
clocking each sub-ADC at a rate of FS/N;
each sub-ADC generating two digital samples at a rate of FS/(N), wherein generating two digital samples at a rate of Fs/N comprises generating a first of the two digital samples approximately at a rising or a falling edge of a first Fs/(2*N) clock and generating a second of the two digital samples approximately at a rising or falling edge of a second Fs/(2*N) clock, the second Fs/(2*N) clock delayed from the first Fs/(2*N) clock by a period of time of approximately N/(Fs);
combining outputs of the sub-ADCs to generate digital samples at a rate of Fs.

25. An Ethernet transceiver comprising a high-speed analog to digital converter (ADC) circuit, the ADC circuit comprising:
a plurality of N/2 sub-ADCs, each sub-ADC receiving an analog signal and a clock signal and generating two digital samples at a rate of Fs/N, wherein generating two digital samples at a rate of Fs/N comprises generating a first of the two digital samples approximately at a rising edge of an Fs/N clock and generating a second of the two digital samples approximately at a falling edge of the Fs/N clock; and wherein
the plurality of N/2 sub-ADCs of the time-interleaved ADC system generate combined output samples at a rate of Fs.

* * * * *